United States Patent
Yang et al.

(10) Patent No.: US 7,766,212 B2
(45) Date of Patent: Aug. 3, 2010

(54) SPOOL WOUND WITH A GOLD ALLOY WIRE USED FOR A BONDING PROCESS

(75) Inventors: Dong-Ik Yang, Incheon (KR);
Eun-Kyun Chung, Incheon (KR);
Joong-Geun Shin, Incheon (KR);
Nam-Kwon Cho, Incheon (KR)

(73) Assignee: W.C. Heraeus GmbH, Hanau (DE)

( * ) Notice: Subject to any disclaimer, the term of this patent is extended or adjusted under 35 U.S.C. 154(b) by 141 days.

(21) Appl. No.: 12/233,201

(22) Filed: Sep. 18, 2008

(65) Prior Publication Data
US 2009/0072063 A1 Mar. 19, 2009

(30) Foreign Application Priority Data
Sep. 18, 2007 (KR) .................. 10-2007-0094711

(51) Int. Cl.
*B23K 37/00* (2006.01)
*B65H 75/14* (2006.01)

(52) U.S. Cl. .................. 228/4.5; 228/180.5; 242/610.5; 242/610.6

(58) Field of Classification Search ........................ None
See application file for complete search history.

(56) References Cited

U.S. PATENT DOCUMENTS

| | | | |
|---|---|---|---|
| 2,195,358 A * | 3/1940 | Clinton | 242/118.8 |
| 3,438,226 A * | 4/1969 | Dalpiaz | 68/198 |
| 4,191,345 A * | 3/1980 | Sato et al. | 242/346 |
| 4,998,002 A | 3/1991 | Okikawa et al. | |
| 5,031,821 A | 7/1991 | Kaneda et al. | |
| 5,205,507 A * | 4/1993 | Satoh et al. | 242/586.3 |
| 6,164,577 A * | 12/2000 | Koike | 242/322 |
| 6,381,935 B1 * | 5/2002 | Wattron et al. | 56/14.9 |
| 7,523,765 B2 * | 4/2009 | Quigley et al. | 138/129 |

FOREIGN PATENT DOCUMENTS

| | | |
|---|---|---|
| DE | 102006035776 A1 | 8/2007 |
| JP | 10027819 A | 1/1998 |
| JP | 2000174055 A | 6/2000 |
| JP | 2004087545 A | 3/2004 |

* cited by examiner

*Primary Examiner*—Kiley Stoner
(74) *Attorney, Agent, or Firm*—Panitch Schwarze Belisario & Nadel LLP

(57) ABSTRACT

A spool includes a body and a chromium layer. The body integrally includes a first portion having an annular shape and a second portion having a tubular shape. The body is formed using plastic. The first portion is provided on both sides of the second portion. The chromium layer is plated on the body. The chromium layer has a uniform thickness of about 0.1 µm to about 100 µm. A gold alloy wire is wound on the chromium layer. The chromium layer has a glossy surface. The spool is combined with a bonding device such that the spool electrically connects the bonding device to the gold alloy wire wound on the chromium layer. The shape of the spool is not easily changed by an external impact. When the gold alloy wire is wound on the spool, a scratch is not formed on the spool. Furthermore, the cost required for forming the spool is relatively small so that the spool may be used as an expendable supply. As a result, a recycling process is not required.

8 Claims, 3 Drawing Sheets

FIG. 3
FIG. 4
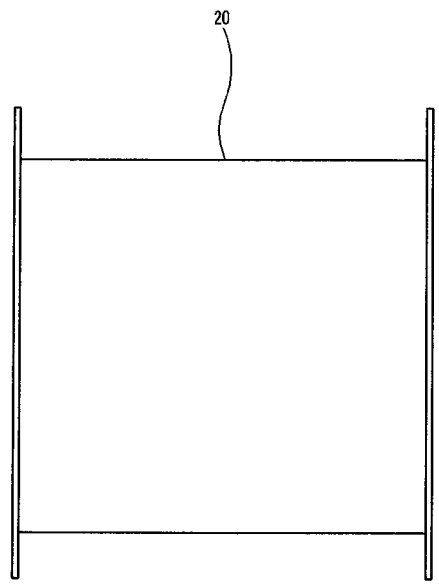
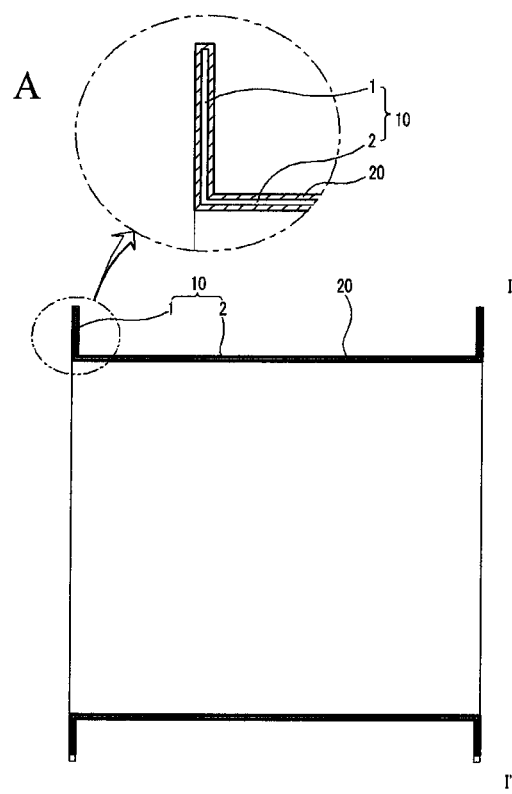

SPOOL WOUND WITH A GOLD ALLOY WIRE USED FOR A BONDING PROCESS

CROSS-REFERENCE TO RELATED APPLICATIONS

This application claims priority to Korean Patent Application No. 10-2007-0094711, filed Sep. 18, 2007. The contents of Korean Patent Application No. 10-2007-0094711 are hereby incorporated by reference into the present application in their entirety.

BACKGROUND OF THE INVENTION

The present invention is related to a spool where a gold alloy wire for a bonding process is wound. Particularly, the present invention is related to a spool where a gold alloy wire bonded on a pad of a printed circuit board is wound.

To form a conventional spool where a wire is wound, a preliminary spool including aluminum is formed. An anodizing process is performed on a surface of the preliminary spool so that the conventional spool may be obtained. The anodized surface of the conventional spool is not conductive. Thus, the wire is required to be physically connected to a bonding device in order that an electric signal may be communicated between the wire and the bonding device.

FIG. 1 is a front perspective photograph of a conventional spool combined with a bonding device.

In FIG. 1, the wire wound on the conventional spool is physically connected to the bonding device such that an electric signal may be communicated between the wire and the bonding device.

If the conventional spool is employed, an end portion of the wire wound on the conventional spool is required to be physically connected to the bonding device. Thus, the time required for performing a bonding process may increase. In addition, the efficiency of the bonding process may decrease.

The conventional spool may be easily damaged by an external impact, because the conventional spool is formed by the anodizing process. For example, a scratch may be formed on the conventional spool by the wire.

In addition, the cost required for forming the conventional spool is relatively large, because the preliminary spool is formed using aluminum. Thus, a recycling process incurring an additional cost is required.

BRIEF SUMMARY OF THE INVENTION

The present invention is directed to a cheap and durable spool capable of connecting a bonding device to a wire without a physical contact between the bonding device and the wire.

In accordance with the embodiments of the present invention, a spool includes a body and a chromium layer. The body integrally includes a first portion having an annular shape and a second portion having a tubular shape. The body is formed using plastic. The first portion is provided on both sides of the second portion. The chromium layer is plated on the body. A gold alloy wire is wound on the chromium layer. The chromium layer is combined with a bonding device such that the bonding device is electrically connected to the chromium layer. The gold alloy wire wound on the chromium layer is electrically connected to the bonding device through the chromium layer without a physical contact between the gold alloy wire and the bonding device.

The chromium layer may have a thickness of 0.1 μm to 100 μm. The plastic may be acrylonitrile butadiene styrene copolymer or polystyrene copolymer. The chromium layer may be formed using trivalent chromium. The chromium layer may have a glossy surface. The spool may further include a first adhesion layer formed on the body and a second adhesion layer formed on the first adhesion layer. The chromium layer may be formed on the second adhesion layer. The first adhesion layer may include copper or nickel. The second adhesion layer may include nickel.

According to embodiments of the present invention, the combining portion of the bonding device may be electrically connected to the gold alloy wire wound on the spool, even though the combining portion of the bonding device is not in physical contact with the gold alloy wire. As a result, the time required for performing the bonding process may be reduced. In addition, the efficiency of the bonding process may increase.

Chromium has a relatively large intensity, a relatively large corrosion resistance and a relatively large durability. Thus, the shape of the spool is not easily changed by an external impact. In addition, when the gold alloy wire is wound on the spool, a scratch may not be formed on the spool.

Furthermore, the cost required for forming the spool is relatively small. Thus, the spools may be used like expendable supplies. As a result, a recycling process may not be required.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIG. 3 is a schematic longitudinal view of the spool in FIG. 2.

FIG. 4 is a cross-sectional view taken along the line I-I' in FIG. 2.

DETAILED DESCRIPTION OF THE INVENTION

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art. It will also be understood that, although the terms "first," "second," etc., may be used herein to describe various elements, components, regions, layers and/or sections, these elements, components, regions, layers and/or sections should not be limited by these terms. Rather, these terms are used merely as a convenience to distinguish one element, component, region, layer and/or section from another element, component, region, layer and/or section. For example, a first element, component, region, layer and/or section could be termed a second element, component, region, layer and/or section without departing from the teachings of the present invention.

Figure 2:
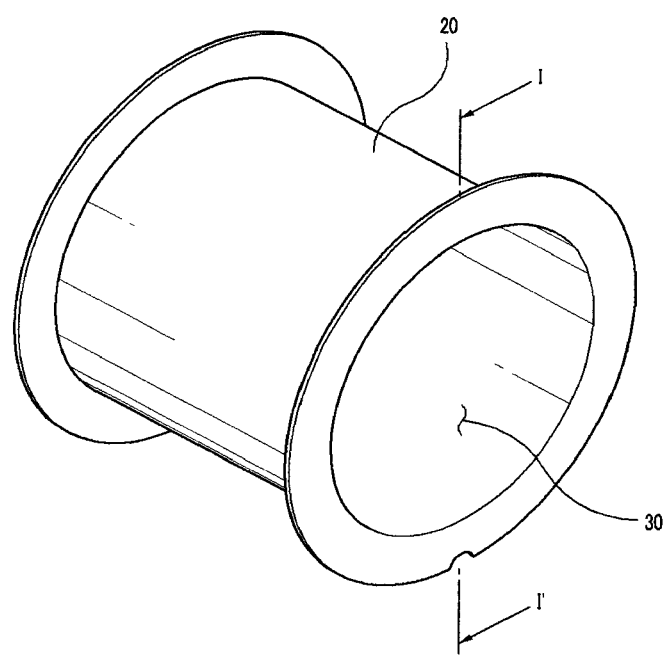
FIG. 2 is a schematic longitudinal perspective view of a spool in accordance with an embodiment of the present invention.

FIG. 2 is a schematic longitudinal perspective view of a spool in accordance with an embodiment of the present invention. FIG. 3 is a schematic longitudinal view of the spool in FIG. 2. FIG. 4 is a cross-sectional view taken along the line I-I' in FIG. 2.

Referring to FIGS. 2 to 4, a spool where a gold alloy wire for a bonding process is to be wound may include a body 10 and a chromium layer 20. The body 10 may include a first portion 1 having a substantially annular shape and a second portion 2 having a substantially tubular shape. The first portion 1 may be provided on both sides of the second portion 2. The first and second portions 1 and 2 may be formed as one body. "A" in FIG. 4 is a detail view of a portion of the spool which shows the arrangement of the first portion 1, the second portion 2, and the chromium layer 20.

The body 10 may be formed using a material capable of being plated with a metal. For example, the body 10 may be formed using a plastic. Particularly, the plastic used to form the body 10 may be acrylonitrile butadiene styrene (ABS) copolymer or polystyrene (PS) copolymer. If the body 10 is formed using ABS copolymer or PS copolymer, a transformation of the body 10 may be prevented in a metal plating process.

As described above, the first portion 1 and the second portion 2 may have an annular shape and tubular shape, respectively. However, many apparent variations of the shapes of the first and second portions 1 and 2 are possible in accordance with a bonding device where the spool is to be combined.

The chromium layer 20 may be plated on the body 10. The chromium layer 20 may have a substantially uniform thickness. Thus, the spool may be conformed to the body 10. The spool may have a hole 30 where the bonding device is to be combined.

When a thickness of the chromium layer 20 is less than about 0.1 µm, the body 10 may be outwardly exposed. In addition, the shape of the spool may be changed by a relatively small force. On the other hand, when the thickness of the chromium layer 20 is more than about 100 µm, a surface defect such as a crack or a pin hole may be formed. Thus, the thickness of the chromium layer 20 is about 0.1 µm to about 100 µm.

If the chromium layer 20 has a glossy surface, a surface uniformity of the chromium layer 20 may be relatively greater than that of the chromium layer 20 having a lusterless surface. When the surface uniformity increases, a contact area between the chromium layer 20 and the gold alloy wire for the bonding process may increase. Thus, a contact resistance between the chromium layer 20 and the gold alloy wire may decrease. As a result, the chromium layer 20 may advantageously have the glossy surface.

Hexavalent chromium may cause environmental pollution. In addition, hexavalent chromium is classified as a toxic material to human health. Thus, trivalent chromium may be advantageously used instead of hexavalent chromium. However, if hexavalent chromium may be safely obtained, hexavalent chromium may be used.

In addition, a first adhesion layer and a second adhesion layer may be formed on the body 10 before the chromium layer 20 is formed on the body 10. Particularly, the first adhesion layer including copper or nickel is plated on the body 10. The second adhesion layer including nickel is then plated on the first adhesion layer. Thereafter, the chromium layer 20 is plated on the second adhesion layer. Here, the first and second adhesion layers may increase an adhesive property of the chromium layer 20 with respect to the plastic body 10.

Figure 5:
FIG. 5 is a front perspective photograph of the spool in FIGS. 2 to 4 combined with a bonding device.

FIG. 5 is a front perspective photograph of the spool in FIGS. 2 to 4 combined with a bonding device.

In FIG. 5, a combining portion of the bonding device is inserted into the hole of the spool such that the combining portion of the bonding device may make electric contact with an inner face of the hole. Thus, the combining portion of the bonding device is electrically connected to the spool so that the combining portion of the bonding device may be electrically connected to the gold alloy wire wound around the spool.

Figure 1:
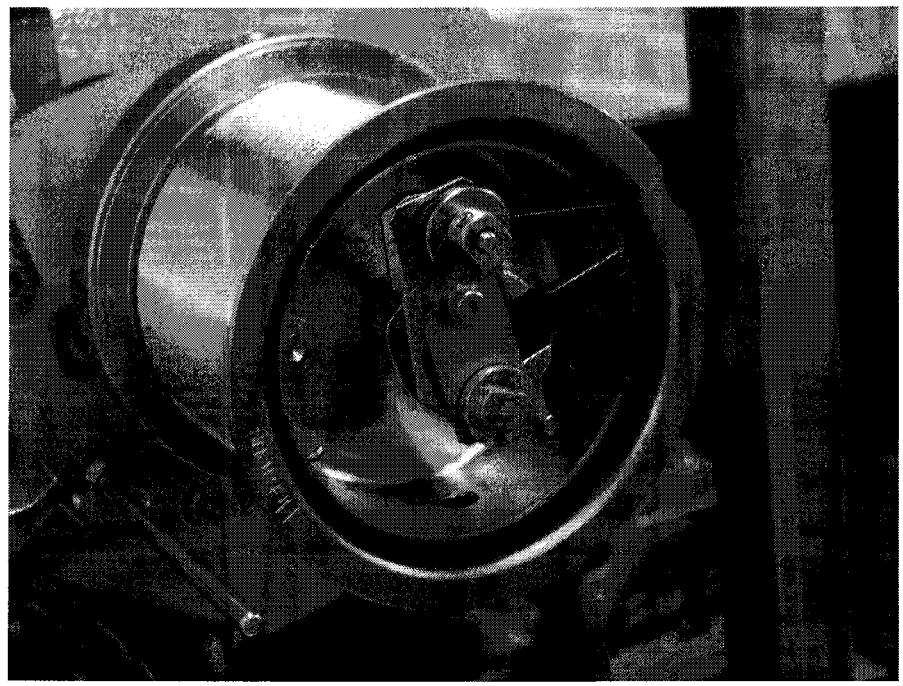
FIG. 1 is a front perspective photograph of a conventional spool combined with a bonding device.

That is, if the spool of the present invention, which is different from the conventional spool in FIG. 1, is employed, the spool having an electric conductivity may serve to electrically connect the bonding device to the gold alloy wire wound on the spool. Thus, the combining portion of the bonding device may be electrically connected to the gold alloy wire wound on the spool even though the combining portion of the bonding device is not physically attached to the gold alloy wire. As a result, the time required for performing the bonding process may be reduced. In addition, the efficiency of the bonding process may increase.

Chromium has a relatively large intensity, a relatively large corrosion resistance and a relatively large durability. Thus, the shape of the spool may not be easily changed by an external impact. In addition, when the gold alloy wire is wound on the spool, a scratch may not be formed on the spool.

As described above, the spool is formed by plating the chromium layer 20 on the body 10, the latter including plastic that is relatively cheap. Thus, the cost required for forming the spool is relatively small. As a result, spools may be used as expendable supplies without a recycling process.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A spool comprising:
   a body integrally including a first portion having an annular shape and a second portion having a tubular shape, the body comprising plastic, the first portion being provided on both ends of the second portion,
   a chromium layer plated on the body, and
   a gold alloy wire wound on the chromium layer, wherein the chromium layer is combined with a bonding device such that the bonding device is electrically connected to the chromium layer and the gold alloy wire wound on the chromium layer is electrically connected to the bonding device through the chromium layer without a physical contact between the gold alloy wire and the bonding device.

2. The spool of claim 1, wherein the chromium layer has a thickness of 0.1 µm to 100 µm.

3. The spool of claim 1, wherein the plastic comprises acrylonitrile butadiene styrene copolymer or polystyrene copolymer.

4. The spool of claim 1, wherein the chromium layer comprises trivalent chromium.

5. The spool of claim 1, wherein the chromium layer has a glossy surface.

6. The spool of claim 1, further comprising a first adhesion layer formed on the body and a second adhesion layer formed on the first adhesion layer, wherein the chromium layer is formed on the second adhesion layer.

7. The spool of claim 6, wherein the first adhesion layer comprises copper or nickel.

8. The spool of claim 6, wherein the second adhesion layer comprises nickel.

* * * * *